(12) United States Patent
Wang et al.

(10) Patent No.: US 11,899,868 B2
(45) Date of Patent: Feb. 13, 2024

(54) ARRAY SUBSTRATE, TOUCH DISPLAY PANEL, AND TOUCH DISPLAY DEVICE (71) Applicants: BEIJING BOE DISPLAY TECHNOLOGY CO., LTD., Beijing (CN); BOE TECHNOLOGY GROUP CO., LTD., Beijing (CN)

(72) Inventors: Mengjie Wang, Beijing (CN); Xiaona Liu, Beijing (CN); Xibin Shao, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/918,593

(22) PCT Filed: Oct. 14, 2021

(86) PCT No.: PCT/CN2021/123902
§ 371 (c)(1),
(2) Date: Oct. 13, 2022

(87) PCT Pub. No.: WO2022/105495
PCT Pub. Date: May 27, 2022

(65) Prior Publication Data
US 2023/0244344 A1 Aug. 3, 2023

(30) Foreign Application Priority Data
Nov. 20, 2020 (CN) .......................... 202011312811.7

(51) Int. Cl.
G06F 3/041 (2006.01)
G06F 3/044 (2006.01)
(Continued)

(52) U.S. Cl.
CPC .......... *G06F 3/0412* (2013.01); *G02F 1/1362* (2013.01); *G02F 1/13338* (2013.01);
(Continued)

(58) Field of Classification Search
CPC .... G06F 3/041; G06F 3/0412; G06F 3/04164; G06F 3/04184; G06F 3/0443;
(Continued)

(56) References Cited

U.S. PATENT DOCUMENTS 11,237,656 B2 * 2/2022 Zhang .................... G06F 3/0412
11,415,853 B2 * 8/2022 Fang .................. G02F 1/134309
(Continued)

FOREIGN PATENT DOCUMENTS

CN 107085487 A 8/2017
CN 108254983 A 7/2018
(Continued)

OTHER PUBLICATIONS

Translation of CN-108732832A (Year: 2018).*

*Primary Examiner* — Jason M Mandeville
(74) *Attorney, Agent, or Firm* — IP & T GROUP LLP (57) ABSTRACT An array substrate includes multiple pixel electrodes constituting first pixel electrode columns, second pixel electrode columns and third pixel electrode columns, and data lines including first data lines, second data lines and third data lines. A first data line, a first pixel electrode column, a second data line, a second pixel electrode column, a third data line and a third pixel electrode column are arranged in sequence in a row direction. Distances between the first pixel electrode column and the first data line, between the second pixel electrode column and the second data line, between the third pixel electrode column and the third data line, and between the first pixel electrode column and the second data line are a first distance to a fourth distance,
(Continued)

respectively. The first distance is less than the fourth distance and greater than the second distance and/or the third distance.

19 Claims, 5 Drawing Sheets

(51) Int. Cl.
  *G02F 1/1333*  (2006.01)
  *G02F 1/1343*  (2006.01)
  *G02F 1/1362*  (2006.01)
  *H01L 27/12*  (2006.01)

(52) U.S. Cl.
  CPC .. *G02F 1/134309* (2013.01); *G02F 1/136286* (2013.01); *G06F 3/041* (2013.01); *G06F 3/0443* (2019.05); *G06F 3/0446* (2019.05); *G06F 3/04164* (2019.05); *G06F 3/04184* (2019.05); *H01L 27/124* (2013.01); *G06F 2203/04103* (2013.01); *G09G 2300/04* (2013.01); *G09G 2300/0404* (2013.01); *G09G 2300/0426* (2013.01)

(58) Field of Classification Search
  CPC ......... G06F 3/0446; G06F 2203/04103; G02F 1/13338; G02F 1/134309; G02F 1/1362; G02F 1/136286; H01L 27/124; G09G 2300/04; G09G 2300/0404; G09G 2300/0426
  USPC .......................................................... 345/174
  See application file for complete search history.

(56) References Cited

U.S. PATENT DOCUMENTS

| | | |
|---|---|---|
| 2016/0378239 A1 | 12/2016 | Lee et al. |
| 2017/0277008 A1 | 9/2017 | Jiang et al. |
| 2020/0233251 A1 | 7/2020 | Tang et al. |
| 2020/0409496 A1 | 12/2020 | An |
| 2021/0223645 A1* | 7/2021 | Guo .................... G09G 3/3607 |
| 2021/0342027 A1 | 11/2021 | Zhang et al. |
| 2023/0143328 A1* | 5/2023 | Mei ....................... H01L 27/124 |
| | | 257/59 |

FOREIGN PATENT DOCUMENTS

| | | |
|---|---|---|
| CN | 108732832 A | 11/2018 |
| CN | 109164629 A | 1/2019 |
| CN | 109407896 A | 3/2019 |
| CN | 109683743 A | 4/2019 |
| CN | 211348942 U | 8/2020 |

* cited by examiner

ARRAY SUBSTRATE, TOUCH DISPLAY PANEL, AND TOUCH DISPLAY DEVICE

CROSS-REFERENCE TO RELATED APPLICATIONS

This application is a national phase entry under 35 USC 371 of International Patent Application No. PCT/CN2021/123902, filed on Oct. 14, 2021, which claims priority to Chinese Patent Application No. 202011312811.7, filed on Nov. 20, 2020, which are incorporated herein by reference in their entirety.

TECHNICAL FIELD

The present disclosure relates to the field of display technologies, and in particular, to an array substrate, a touch display panel, and a touch display device.

BACKGROUND

With the continuous development of the touch technology, the touch technology is increasingly used in display devices such as mobile phones, tablets and notebook computers.

At present, in a display device with a touch function (i.e., a touch display device), a touch driver and a display driver can be integrated into a chip through the touch and display driver integration (TDDI) technology, so as to use one chip to control touch operation and display operation.

SUMMARY

In an aspect, an array substrate is provided. The array substrate includes a substrate, a plurality of pixel electrodes, a plurality of data lines and a plurality of touch lines. The plurality of pixel electrodes are disposed on the substrate and distributed in an array, in the plurality of pixel electrodes, pixel electrodes arranged in a column constitute a pixel electrode column. The plurality of data lines and a plurality of touch lines are disposed on the substrate, and the plurality of data lines and the plurality of touch lines are disposed in a same layer.

The plurality of pixel electrodes include first pixel electrode columns, second pixel electrode columns and third pixel electrode columns; the plurality of data lines include: first data lines each coupled to a first pixel electrode column, second data lines each coupled to a second pixel electrode column, and third data lines each coupled to a third pixel electrode column. In a row direction of the plurality of pixel electrodes, a first data line coupled to the first pixel electrode column, the first pixel electrode column, a second data line coupled to the second pixel electrode column, the second pixel electrode column, a third data line coupled to the third pixel electrode column and the third pixel electrode column are arranged in sequence.

The plurality of touch lines include first touch lines, a first touch line in the first touch lines is located between the first pixel electrode column and the second data line. A distance between the first pixel electrode column and the first data line is a first distance, a distance between the second pixel electrode column and the second data line is a second distance, a distance between the third pixel electrode column and the third data line is a third distance, and a distance between the first pixel electrode column and the second data line is a fourth distance; and the first distance is less than the fourth distance, and the first distance is greater than at least one of the second distance and the third distance.

In some embodiments, the first distance is greater than the second distance and the third distance, and the second distance is equal to the third distance.

In some embodiments, distances between the second pixel electrode column and two data lines that are respectively located on two sides thereof and adjacent thereto are equal. Distances between the third pixel electrode column and two data lines that are respectively located on two sides thereof and adjacent thereto are equal.

In some embodiments, the plurality of touch lines further include second touch lines, a second touch line in the second touch lines is located between the second pixel electrode column and the third data line. A distance between the second pixel electrode column and the third data line is a fifth distance, the fifth distance is greater than the second distance, and the second distance is greater than the third distance.

In some embodiments, the second distance is equal to the first distance.

In some embodiments, the plurality of data lines further include fourth data lines, a fourth data line in the fourth data lines is located on a side of the third pixel electrode column away from the third data line. The plurality of touch lines further include third touch lines, a third touch line in the third touch lines is located between the third pixel electrode column and the fourth data line. A distance between the third pixel electrode column and the fourth data line is a sixth distance, the sixth distance is greater than the third distance, and the third distance is greater than the second distance.

In some embodiments, the third distance is equal to the first distance.

In some embodiments, the first distance is in a range of 5.8 μm to 14 μm, inclusive; and at least one of the second distance and the third distance is less than or equal to 5.2 μm.

In some embodiments, the first distance is 6 μm; and the at least one of the second distance and the third distance is 5 μm.

In some embodiments, a distance between the first touch line and the first pixel electrode column is a seventh distance, a distance between the first touch line and the second data line is an eighth distance, and the seventh distance is greater than the eighth distance.

In some embodiments, the seventh distance is in a range of 1 μm to 10 μm, inclusive; and the eighth distance is in a range of 1 μm to 10 μm, inclusive.

In some embodiments, the seventh distance is 5.7 μm; and the eighth distance is 4.5 μm.

In some embodiments, the first distance is greater than the seventh distance.

In some embodiments, the array substrate further includes a common electrode layer. The common electrode layer is located on a side of the plurality of pixel electrodes away from the substrate. The common electrode layer has at least one group of slits corresponding to a pixel electrode in the plurality of pixel electrodes, each group of slits includes a plurality of slits arranged in parallel, and an included angle between each slit and a column direction of the plurality of pixel electrodes is in a range of 5° to 20°, inclusive.

In another aspect, a touch display panel is provided. The touch display panel includes the array substrate as described in any one of the above embodiments. A polarity inversion mode of the touch display panel is column inversion.

In some embodiments, the touch display panel further includes a color filter layer, and the color filter layer includes filter patterns of a first color, filter patterns of a second color, and filter patterns of a third color. Each pixel electrode in the first pixel electrode column corresponds to a position where a filter pattern of the first color in the filter patterns of the first color is located. Each pixel electrode in the second pixel electrode column corresponds to a position where a filter pattern of the second color in the filter patterns of the second color is located. Each pixel electrode in the third pixel electrode column corresponds to a position where a filter pattern of the third color in the filter patterns of the third color is located. The first color is blue, one of the second color and the third color is red, and another one of the second color and the third color is green.

In some embodiments, in a case where the array substrate includes second touch lines, the second color is red, and the third color is green; or in a case where the array substrate includes third touch lines, the second color is green, and the third color is red.

In yet another aspect, a touch display device is provided. The touch display device includes the touch display panel as described in any one of the above embodiments.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art can obtain other drawings according to these drawings. In addition, the accompanying drawings to be described below may be regarded as schematic diagrams, and are not limitations on actual sizes of products, actual processes of methods and actual timings of signals involved in the embodiments of the present disclosure.

DETAILED DESCRIPTION

Technical solutions in some embodiments of the present disclosure will be described clearly and completely with reference to accompanying drawings below. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, the term "comprise" and other forms thereof such as the third-person singular form "comprises" and the present participle form "comprising" throughout the specification and the claims are construed as an open and inclusive meaning, i.e., "including, but not limited to". In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or examples(s). In addition, the specific features, structures, materials or characteristics may be included in any one or more embodiments or examples in any suitable manner.

Hereinafter, the terms "first" and "second" are used for descriptive purposes only, and are not to be construed as indicating or implying the relative importance or implicitly indicating the number of indicated technical features. Thus, a feature defined with "first" or "second" may explicitly or implicitly include one or more of the features. In the description of the embodiments of the present disclosure, the terms "a plurality of/the plurality of" and "multiple" each mean two or more unless otherwise specified.

In the description of some embodiments, the terms "coupled", "connected" and derivatives thereof may be used. For example, the term "connected" may be used in the description of some embodiments to indicate that two or more components are in direct physical or electrical contact with each other. As another example, the term "coupled" may be used in the description of some embodiments to indicate that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the content herein.

The phrase "at least one of A, B and C" has a same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

The phrase "applicable to" or "configured to" used herein means an open and inclusive expression, which does not exclude devices that are applicable to or configured to perform additional tasks or steps.

Exemplary embodiments are described herein with reference to sectional views and/or plan views as idealized exemplary accompanying drawings. In the accompanying drawings, thicknesses of layers and sizes of regions are enlarged for clarity. Variations in shape relative to the accompanying drawings due to, for example, manufacturing technologies and/or tolerances may be envisaged. Therefore, the exemplary embodiments should not be construed as being limited to the shapes of the regions shown herein, but including deviations due to, for example, manufacturing.

For example, an etched region shown to have a rectangular shape generally has a feature of being curved. Therefore, the regions shown in the accompanying drawings are schematic in nature, and their shapes are not intended to show actual shapes of regions in a device, and are not intended to limit the scope of the exemplary embodiments.

Touch and display driver integration (TDDI) electronic products may include products with a hybrid in-cell (HIC) structure and products with a full in-cell (FIC) structure. The FIC product adopts a single-layer touch trace design and uses a self-capacitance principle to realize multi-touch. For the FIC product, touch lines are integrated into a display panel. In the FIC product, a touch line for transmitting a touch signal is located on a side of a data signal line. As a result, data signal lines on a left side and a right side of a certain pixel are asymmetric, and coupling capacitances formed by a pixel electrode of the pixel and the data signal lines on the two sides of the pixel are inconsistent, which affects distribution of liquid crystal molecules around the pixel electrode and thus affects a display effect of the display panel.

At present, a touch display panel may include red sub-pixel columns, green sub-pixel columns, blue sub-pixel columns, a plurality of data lines and a plurality of touch lines, and the plurality of data lines and the plurality of touch lines are disposed in a same layer. A touch line is located between a red sub-pixel column and a green sub-pixel column. That is, the touch line and a data line are disposed between the red sub-pixel column and the green sub-pixel column. The touch line may be located on a left side of the data line.

Based on this, a distance between the red sub-pixel column and a data line connected thereto is f1, and a distance between the red sub-pixel column and a data line adjacent thereto but not connected thereto (which is disposed on a side of the red sub-pixel column away from the data line connected thereto) is f2, and f2 and f1 are different. For example, the touch line is disposed between the red sub-pixel column and the data line adjacent thereto, and thus f2 is greater than f1.

A polarity inversion mode of the touch display panel is column inversion, and the red sub-pixel column includes sub-pixels in M rows. In a grayscale image, during a process of switching two adjacent frames, when a data signal of a red sub-pixel in a first row becomes a data signal of an N-th frame, a data signal of a red sub-pixel in an M-th row (i.e., a last row in a scanning direction) also maintains a data signal of an (N−1)-th frame. That is, when the data signal of the red sub-pixel in the first row in the red sub-pixel column becomes a positive signal, the data signal of the red sub-pixel in the M-th row (which is referred to as a target red sub-pixel below) in the red sub-pixel column is still a negative signal. For example, a coupling capacitance between the target red sub-pixel and a data line connected thereto is Cpd1, and a coupling capacitance between the target red sub-pixel and a data line adjacent thereto is Cpd2. Since f2 is greater than f1, according to a capacitance calculation formula, the coupling capacitance Cpd1 is greater than the coupling capacitance Cpd2. In the N-th frame, a data signal on the data line connected to the target red sub-pixel is a positive signal, and a data signal on the data line adjacent to the target red sub-pixel is a negative signal. Since coupling pull of the data line connected to the target red sub-pixel to a data signal on the target red sub-pixel is greater than coupling pull of the data line adjacent to the target red sub-pixel to the data signal on the target red sub-pixel, the data signal on the target red sub-pixel decreases (for example, from −5 V to −4.9 V). That is, brightness of the target red sub-pixel decreases. Therefore, an image displayed at an end, where the M-th row of sub-pixels is located, of the touch display panel is cyan and dark, and there are significant color difference and brightness difference between two ends of the touch display panel in the scanning direction, which affects a display quality.

In order to solve the problems, some embodiments of the present disclosure provide a touch display device. The touch display device includes a touch display panel.

For example, the touch display device may be any product (e.g., electronic device) or component having a display function and a touch function, such as a display, a television, a digital camera, a mobile phone, a computer, a tablet computer, or a smart watch.

The touch display device may be a liquid crystal display (LCD) device having a touch function. The touch display device may include a glass cover, the touch display panel and a backlight module. The backlight module is configured to provide backlight for the touch display panel. The touch display panel may include an array substrate.

Figure 1:
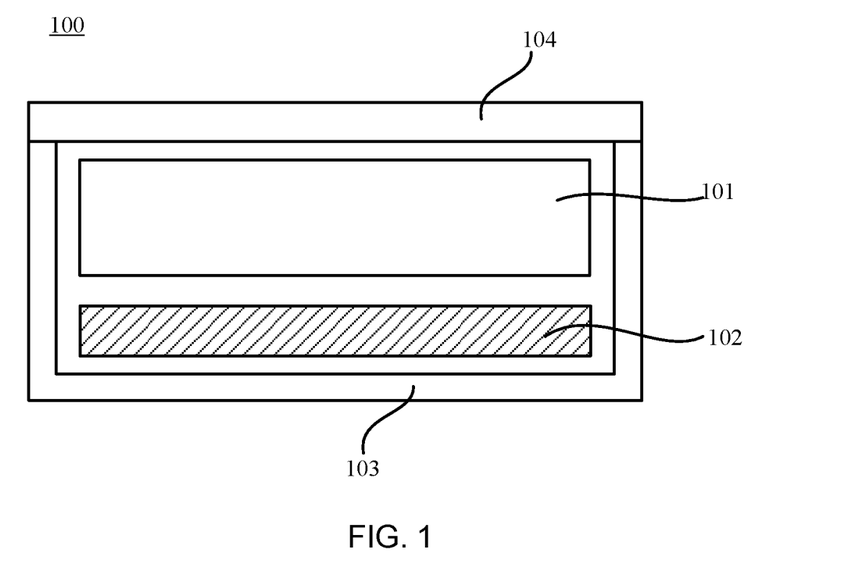
FIG. 1 is a structural diagram of a touch display device provided in some embodiments of the present disclosure.

FIG. 1 is a structural diagram of the touch display device 100 provided in some embodiments of the present disclosure. As shown in FIG. 1, in addition to the touch display panel 101, the touch display device 100 further includes a circuit board 102, a frame 103, a glass cover 104, and other electronic accessories.

For example, as shown in FIG. 1, a section of the frame 103 in a thickness direction of the touch display panel 101 is U-shaped, and the touch display panel 101, the circuit board 102 and the other electronic accessories are disposed in the frame 103. The circuit board 102 is disposed on a side of the touch display panel 101 facing away from a light exit surface of the touch display panel 101. That is, the circuit board 102 is disposed under the touch display panel 101. The glass cover 104 is disposed on a side of the light exit surface of the touch display panel 101. That is, the glass cover 104 is disposed above the touch display panel 101.

The circuit board 102 is configured to provide the touch display panel 101 with signals required for display. For example, the circuit board 102 is a printed circuit board assembly (PCBA). The PCBA includes a printed circuit board (PCB), and a timing controller (TCON), a power management integrated circuit (PMIC) and other integrated circuits (ICs) or circuits that are disposed on the PCB.

Figure 2:
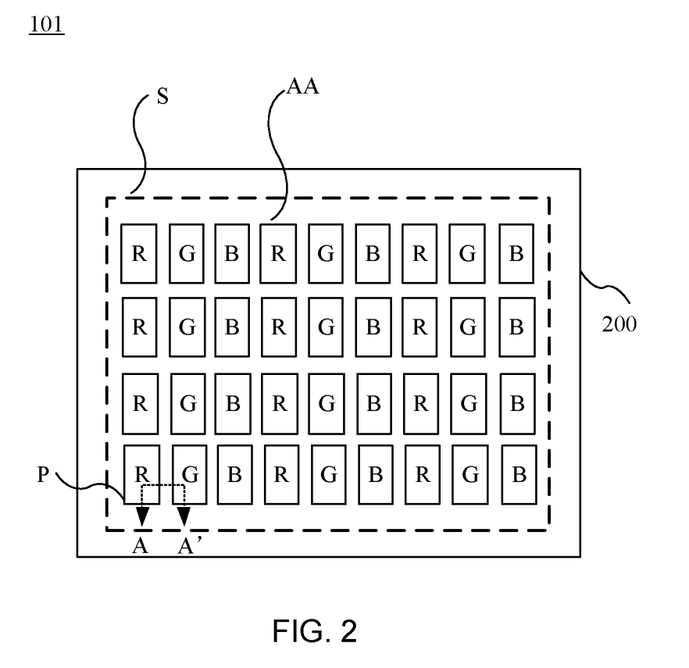
FIG. 2 is a top view of a touch display panel provided in some embodiments of the present disclosure.

FIG. 2 is a top view showing a structure of the touch display panel 101 provided in some embodiments of the present disclosure. As shown in FIG. 2, the touch display panel 101 has a display area AA and a peripheral area S disposed on at least one side of the display area AA. According to different designs of the touch display panel 101, a specific position of the peripheral area S may be changed accordingly. For example, the peripheral area S is arranged around the display area AA. As another example, the peripheral area S is located on one side of the display area AA. As yet another example, the peripheral area S is located on two opposite sides of the display area AA.

The display area AA includes a plurality of sub-pixel regions P, and each sub-pixel is located in a sub-pixel region P.

For example, a plurality of sub-pixels P include at least sub-pixels of a first color, sub-pixels of a second color and sub-pixels of a third color. For example, the first color may be red R, the second color may be green G, and the third color may be blue B. As another example, the first color may be cyan, the second color may be magenta, and the third color may be yellow.

As another example, the plurality of sub-pixels may be sub-pixels of a same color. Thus, the touch display panel may be a monochrome display panel. The plurality of sub-pixels may be all white sub-pixels. That is, the touch display panel displays black and white. For example, the touch display panel may include the monochromatic display panel such as a writing board or a reader.

Figure 3:
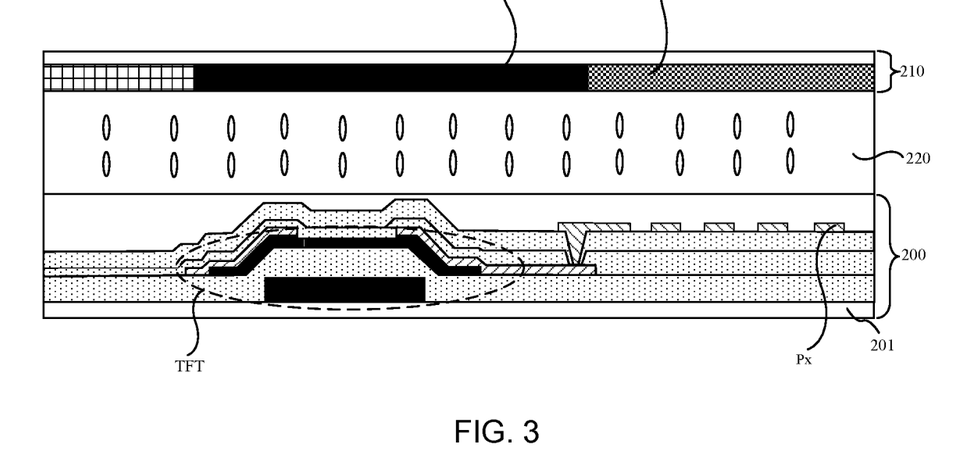
FIG. 3 is a sectional view of the touch display panel shown in FIG. 2 taken along the line A-A' provided in some embodiments of the present disclosure.

FIG. 3 is a sectional view of the touch display panel taken along the line A-A' provided in some embodiments of the present disclosure. As shown in FIG. 3, the touch display panel 101 includes the array substrate 200, an opposite substrate 210, and a liquid crystal layer 220 disposed between the array substrate 200 and the opposite substrate 210.

The array substrate 200 includes a plurality of thin film transistors (TFTs) and a plurality of pixel electrodes Px disposed on a substrate 201. Each TFT and a corresponding pixel electrode Px are connected, and are both located in a sub-pixel region P.

The opposite substrate 210 includes a base substrate and a color filter layer 211 disposed on the base substrate. In this case, the opposite substrate 210 may also be referred to as a color filter (CF) substrate. The color filter layer includes at least red photoresist units, green photoresist units, and blue photoresist units. A red photoresist unit, a green photoresist unit and a blue photoresist unit each are disposed in a respective sub-pixel region P.

In addition, the opposite substrate 210 further includes a black matrix pattern 212 disposed on the base substrate, and the black matrix pattern 212 is used for separating the red photoresist units, the green photoresist units and the blue photoresist units.

Figure 4:
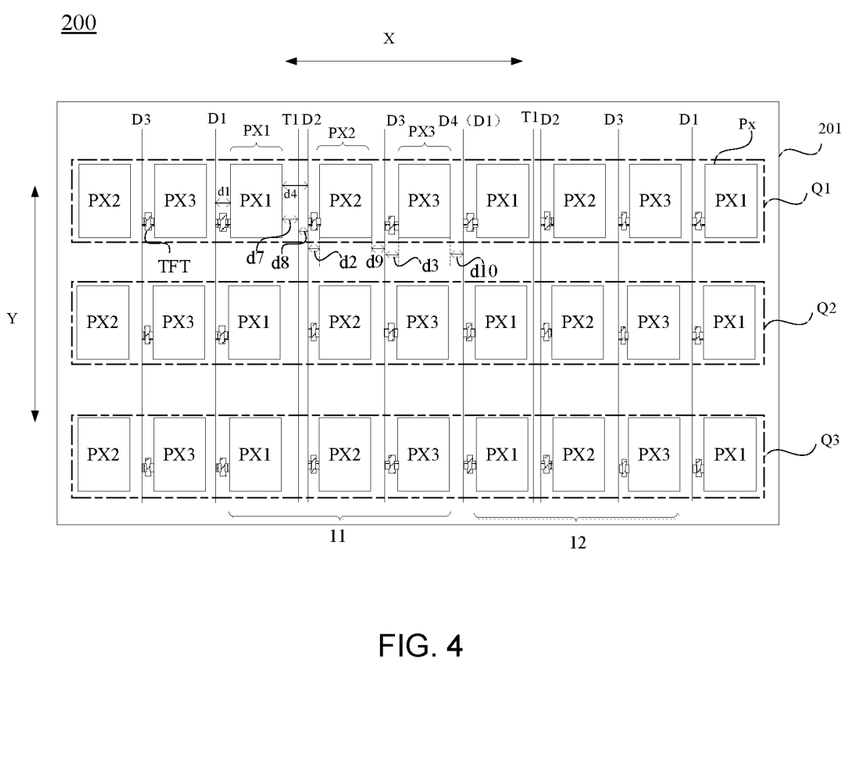
FIG. 4 is a top view of an array substrate provided in embodiments of the present disclosure.

FIG. 4 is a top view of the array substrate 200 provided in some embodiments of the present disclosure. As shown in FIG. 4, the array substrate 200 may include: the substrate 201, and the plurality of pixel electrodes Px distributed in an array, a plurality of data lines and a plurality of touch lines that are disposed on the substrate 201. A data line is connected to a pixel electrode Px through a TFT.

The substrate 201 may be a rigid substrate, e.g., a glass substrate; or the substrate 201 may be a flexible substrate, e.g., a polyimide (PI) substrate.

The plurality of data lines and the plurality of touch lines are disposed in a same layer, and extend along a same direction. For example, the data lines and the touch lines all extend along a column direction Y.

For example, the plurality of pixel electrodes Px are distributed in the array in a row direction X and the column direction Y. In the plurality of pixel electrodes Px, pixel electrodes that are arranged in a column constitute a pixel electrode column (e.g., PX1 PX2, or PX3 shown in FIG. 4). The row direction X and the column direction Y may be perpendicular to each other.

It will be noted that, FIG. 4 only schematically illustrates a case where the pixel electrodes are arranged in three rows and nine columns, and each pixel electrode column only includes three pixel electrodes. However, it is not limited thereto. According to actual situations, the array substrate may include the pixel electrodes arranged in M rows and N columns, and each pixel electrode column includes M pixel electrodes.

Figure 7:
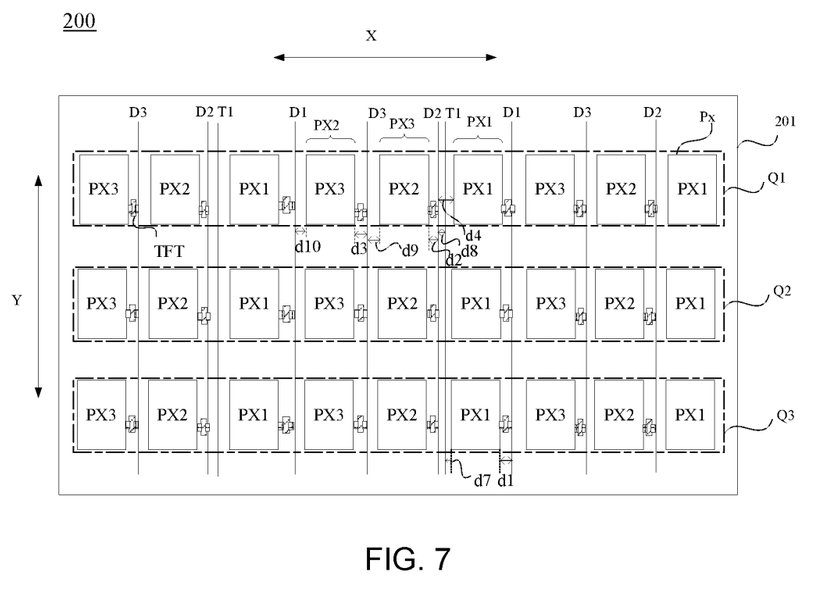
FIG. 7 is a top view of yet another array substrate provided in some embodiments of the present disclosure.

In some embodiments, as shown in FIGS. 4 and 7, the plurality of data lines include: first data lines D1 each coupled to a first pixel electrode column PX1, second data lines D2 each coupled to a second pixel electrode column PX2, and third data lines D3 each coupled to a third pixel electrode column PX3. In the row direction X, the first data line D1, the first pixel electrode column PX1, the second data line D2, the second pixel electrode column PX2, the third data line D3 and the third pixel electrode column PX3 are arranged in sequence. A distance between the first data electrode column PX1 and the first data line D1 is a first distance d1, a distance between the second pixel electrode column PX2 and the second data line D2 is a second distance d2, a distance between the third pixel electrode column PX3 and the third data line D3 is a third distance d3, and a distance between the first pixel electrode column PX1 and the second data line D2 that is connected to the second pixel electrode column PX2 adjacent to the first pixel electrode column PX1 is a fourth distance d4.

For example, as shown in FIG. 4, the data line is connected to the pixel electrode column located on a right side thereof. The first data line D1 is connected to the first pixel electrode column PX1 located on a right side thereof, and the distance between the first data line D1 and the first pixel electrode column PX1 is the first distance d1 the second data line D2 is connected to the second pixel electrode column PX2 located on a right side thereof, and the distance between the second data line D2 and the second pixel electrode column PX2 is the second distance d2; and the third data line D3 is connected to the third pixel electrode column PX3 located on a right side thereof, and the distance between the third data line D3 and the third pixel electrode column PX3 is the third distance d3. The distance between the first pixel electrode column PX1 and the second data line D2 is the fourth distance d4.

In embodiments of the present disclosure, the first pixel electrode column PX1, the second pixel electrode column PX2 and the third pixel electrode column PX3 may constitute a group of pixel electrode columns. As shown in FIG. 4, in the row direction X, a first group of pixel electrode columns 11 are disposed, and a second group of pixel electrode columns 12 consisting of a first pixel electrode column PX1, a second pixel electrode column PX2 and a third pixel electrode column PX3 are further provided. In this case, the data line connected to the first pixel electrode column PX1 included in the second group of pixel electrode columns 12 may be referred to as a fourth data line D4, and the fourth data line D4 may also be the first data line D1.

As another example, as shown in FIG. 7, the data line is connected to the pixel electrode column located on a left side thereof. The first data line D1 is connected to the first pixel electrode column PX1 located on a left side thereof, and the distance between the first data line D1 and the first pixel electrode column PX1 is the first distance d1 the second data line D2 is connected to the second pixel electrode column PX2 located on a left side thereof, and the distance between the second data line D2 and the second pixel electrode column PX2 is the second distance d2; and the third data line D3 is connected to the third pixel electrode column PX3 on a left side thereof, and the distance between the third data line D3 and the third pixel electrode column PX3 is the third distance d3. The distance between the first pixel electrode column PX1 and the second data line D2 that is connected to the second pixel electrode column PX2 adjacent to the first pixel electrode column PX1 is the fourth distance d4.

It will be noted that colors of sub-pixels corresponding to the second pixel electrode column PX2 and colors of sub-pixels corresponding to the third pixel electrode column PX3 are not limited in the embodiments. For example, as shown in FIG. 4, the first pixel electrode column PX1 may correspond to blue sub-pixels, the second pixel electrode column PX2 may correspond to red sub-pixels, and the third pixel electrode column PX3 may correspond to green sub-pixels. As another example, as shown in FIG. 7, the first pixel electrode column PX1 may correspond to blue sub-pixels, the second pixel electrode column PX2 may correspond to green sub-pixels, and the third pixel electrode column PX3 may correspond to red sub-pixels.

In the embodiments, "left side" and "right side" may refer to the left side and right side of the data line in a case where a leading-out terminal of the data line (e.g., the first data line D1) is located on a lower side of the array substrate 200. For example, as shown in FIG. 4, in the case where the leading-out terminal of the data line is located on the lower side of the array substrate 200, that is, in a case where the leading-out terminal of the data line is located on a side of a third sub-pixel row Q3 away from a second sub-pixel row Q2, the first pixel electrode column PX1 is located on the right side of the first data line D1 viewed from the leading-out terminal of the data line to an extension direction of the data line. However, it is not limited thereto, "left side" and "right side" may refer to the left side and the right side of the data line in a case where the leading-out terminal of the data line (e.g., the first data line D1) is located on an upper side of the array substrate 200. For example, as shown in FIG. 4, in the case where the leading-out terminal of the data line is located on the upper side of the array substrate 200, that is, in a case where the leading-out terminal of the data line is located on a side of a first sub-pixel row Q1 away from the second sub-pixel row Q2, the first pixel electrode column PX1 is located on the left side of the first data line D1 viewed from the leading-out terminal of the data line to an extension direction of the data line.

It will be noted that "left side" and "right side" in the embodiments are described by taking an example where the leading-out terminal of the data line is located on the lower side of the array substrate 200.

In some embodiments, as shown in FIG. 4, the plurality of touch lines in the array substrate 200 include only first touch lines T1 each located between the first pixel electrode column PX1 and the second data line D2 that is connected to the second pixel electrode column PX2 adjacent to the first pixel electrode column PX1. The first distance d1 is less than the fourth distance d4. In this way, it may be possible to prevent the first touch line T1 from being in contact with the first pixel electrode column PX1 or the second data line D2 due to a small distance between the first pixel electrode column PX1 and the second data line D2.

According to the above description, the first pixel electrode column PX1 corresponds to the blue sub-pixels. A luminous efficiency of the blue sub-pixel is lower than luminous efficiencies of the red sub-pixel and green sub-pixel. Therefore, the first touch line T1 is arranged between the first pixel electrode column PX1 and the second data line D2, which may greatly reduce an influence of arrangement of the first touch line on reduction of luminous efficiency.

The second distance d2 and the third distance d3 are equal, and the first distance d1 is greater than the second distance d2 and the third distance d3. In this way, it may be possible to increase the first distance d1 to reduce a difference between the first distance d1 and the fourth distance d4, thereby reducing a difference between a first coupling capacitance cpd1 between the first pixel electrode column PX1 and the first data line D1 and a second coupling capacitance cpd2 between the first pixel electrode column PX1 and the second data line D2. As a result, a voltage difference Vp between the first pixel electrode column PX1 and the first data line D1 coupled thereto may be reduced, which may improve the display effect.

It will be noted that a magnitude of Vp is related to a difference between a first coupling capacitance cpd1 between a pixel electrode column and a data line connected thereto and a second coupling capacitance cpd2 between the pixel electrode column and a data line adjacent thereto but not connected thereto. That is, the larger the difference between cpd1 and cpd2, the larger Vp; and the smaller the difference between cpd1 and cpd2, the smaller Vp.

In some embodiments, in the case where the array substrate 200 includes only the first touch lines T1, distances between the second pixel electrode column PX2 and two data lines that are respectively located on two sides thereof and adjacent thereto are equal; and distances between the third pixel electrode column PX3 and two data lines that are respectively located on two sides thereof and adjacent thereto are equal. In this way, coupling capacitances between the second pixel electrode column PX2 and the two data lines adjacent thereto may be equal, and coupling capacitances between the third pixel electrode column PX3 and the two data lines adjacent thereto may also be equal. Thus, in a case where the polarity inversion mode of the touch display panel is the column inversion, coupling effects between each of the two pixel electrode columns and two data lines adjacent to the pixel electrode column (i.e., two adjacent data lines) may cancel out, and do not affect the display effect.

It will be noted that, "two adjacent data lines" does not mean that the two data lines are directly adjacent in a physical position, but means that there is no other data line between the two adjacent data lines.

For example, as shown in FIG. 4, the distance between the second pixel electrode column PX2 and the second data line D2 (i.e., the second distance d2) is equal to a distance d9 between the second pixel electrode column PX2 and the third data line D3 adjacent thereto; and the distance between the third pixel electrode columns PX3 and the third data line D3 (i.e., the third distance d3) is equal to a distance d10 between the third pixel electrode column PX3 and the fourth data line D4 adjacent thereto. That is, d2=d9, and d3=d10.

Figure 5:
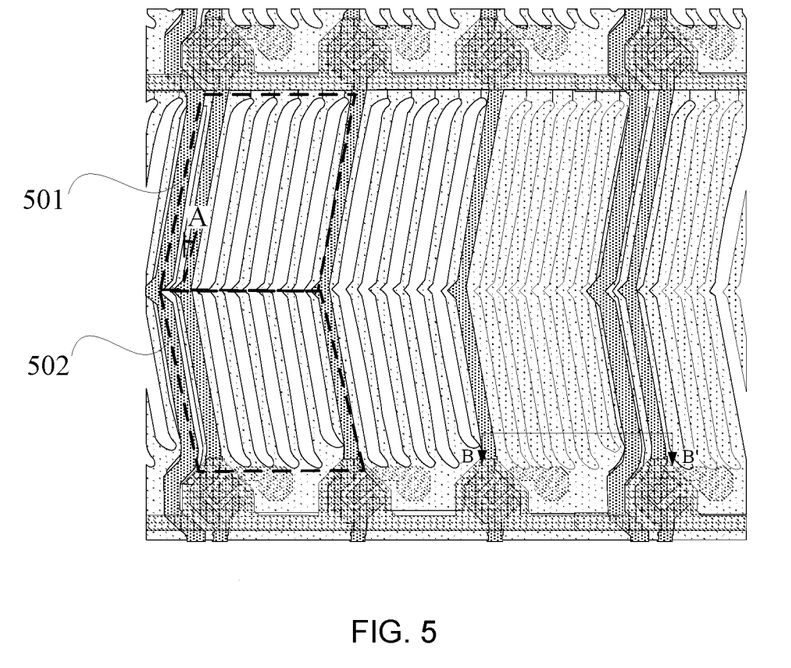
FIG. 5 is a top view of another array substrate provided in embodiments of the present disclosure.
Figure 6:
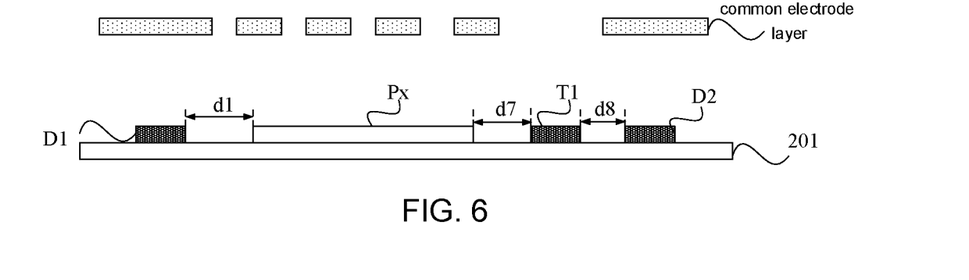
FIG. 6 is a sectional view of the array substrate shown in FIG. 5 taken along the line B-B' provided in some embodiments of the present disclosure.

In some embodiments, as shown in FIG. 6, the array substrate 200 further includes a common electrode layer, and the common electrode layer has at least one group of slits corresponding to a pixel electrode. As shown in FIG. 5, the common electrode layer has two groups of slits corresponding to the pixel electrode, which are slits 501 and slits 502, respectively. Each group of slits includes a plurality of slits arranged in parallel, and an included angle A between each slit and the column direction is in a range of 5° to 20°, inclusive. For example, the included angle may be 5°, 7°, 11°, 15°, or 20°.

There is a preset angle between a direction of a common electrode included in the common electrode layer and the column direction, and the preset angle is the included angle A; and a rubbing direction of an alignment film is parallel to the column direction. That is, there is the included angle A between the rubbing direction of the alignment film and the direction of the common electrode. Therefore, a normal display of the liquid crystal display may be ensured. In addition, in a case where the included angle is 10°, an effect of the user's visual experience may be improved.

In some embodiments, as shown in FIG. 6, the common electrode layer is located on a side of the pixel electrodes Px away from the substrate 201. That is, the common electrode layer is located on an upper side of the pixel electrodes.

As shown in FIGS. 4 and 7, a distance between the first touch line T1 and the first pixel electrode column PX1 adjacent thereto is a seventh distance d7, a distance between the first touch line T1 and the second data line D2 adjacent thereto is an eighth distance d8, and the seventh distance d7 is greater than the eighth distance d8. The seventh distance d7 may be in a range of 1 μm to 10 μm, inclusive. The eighth distance d8 is in a range of 1 μm to 10 μm, inclusive. The seventh distance d7 may be 1 μm, 4 μm, 5 μm, 5.7 μm, 6 μm or 10 μm. The eighth distance d8 may be 1 μm, 3.5 μm, 4 μm, 4.5 μm, 5.5 μm or 10 μm.

In some embodiments, a width of the first touch line T1 may be in a range of 4 μm to 5 μm, inclusive. For example, the width of the first touch line T1 may be 4 μm, 4.5 μm or 5 μm.

Figure 8:
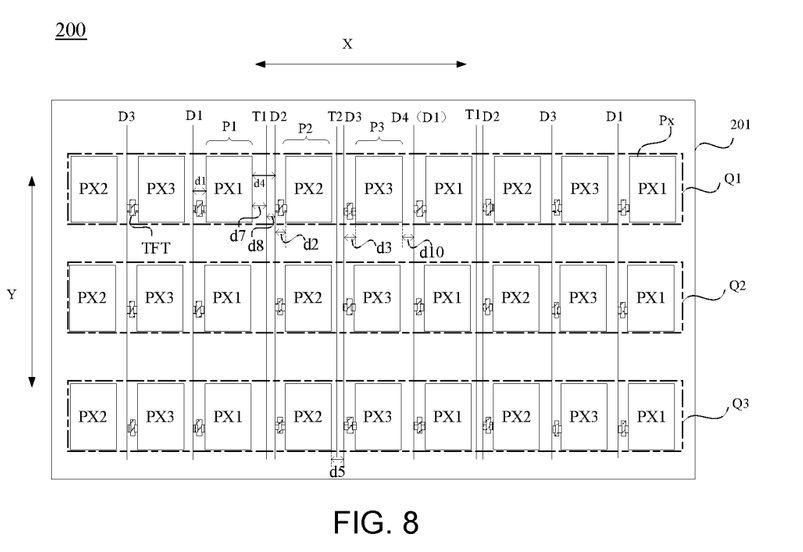
FIG. 8 is a top view of yet another array substrate provided in some embodiments of the present disclosure.

In some embodiments, as shown in FIG. 8, the plurality of touch lines further include second touch lines T2 each located between the second pixel electrode column PX2 and the third data line D3 that is connected to the third pixel electrode column PX3 adjacent to the second pixel electrode column PX2. A distance between the second pixel electrode column PX2 and the third data lines D3 that is connected to the third pixel electrode column PX3 adjacent to the second pixel electrode column PX2 is a fifth distance d5, and the fifth distance d5 is greater than the second distance d2. In this way, it may be possible to prevent the second touch line T2 from being in contact with the second pixel electrode column PX2 or the third data line D3 due to a small distance between the second pixel electrode column PX2 and the third data line D3.

The second distance d2 is greater than the third distance d3, and the second distance d2 is equal to the first distance d1. That is, the first distance d1 is greater than the third distance d3. In this way, it may be possible to increase the second distance d2 to reduce a difference between the second distance d2 and the fifth distance d5, thereby reducing a difference between a coupling capacitance between the second pixel electrode column PX2 and the second data line D2 and a coupling capacitance between the second pixel electrode column PX2 and the third data line D3. As a result, a voltage difference Vp between the second pixel electrode column PX2 and the second data line D2 coupled thereto may be reduced, which may improve the display effect.

Figure 9:
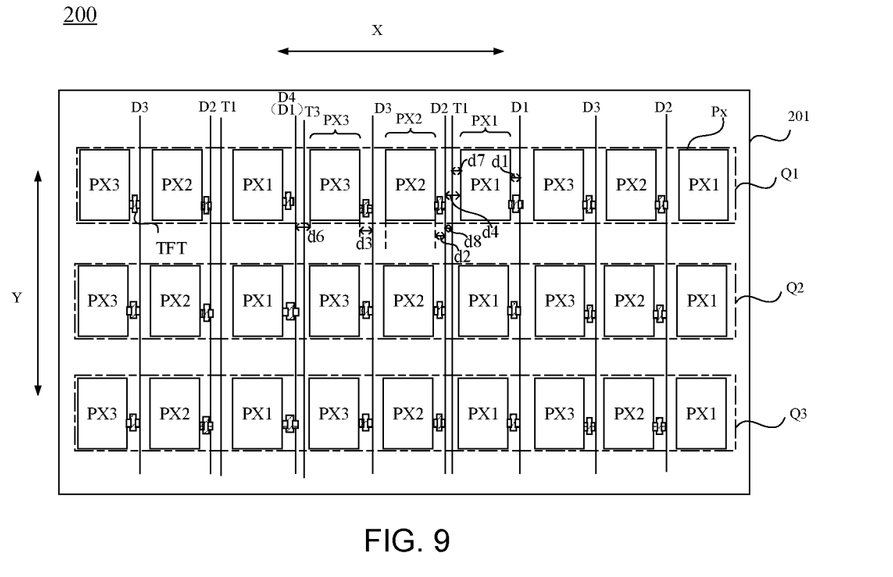
FIG. 9 is a top view of yet another array substrate provided in some embodiments of the present disclosure.

In some embodiments, as shown in FIG. 9, the plurality of data lines further include fourth data lines D4, each of which is located on a side of a third pixel electrode column PX3 away from a third data line D3 coupled to the third pixel electrode column PX3 and is coupled to a pixel electrode column adjacent to the third pixel electrode column PX3. In a case where the plurality of pixel electrodes include only the first pixel electrode columns, second pixel electrode columns and third pixel electrode columns that are alternately arranged in sequence, the fourth data line D4 is the first data line D1 that is coupled to the first pixel electrode column PX1 adjacent to the third pixel electrode column PX3. The plurality of touch lines further include third touch lines T3 each located between the third pixel electrode column PX3 and the fourth data line D4 that is located on the side of the third pixel electrode column PX3 away from the third data line D3 coupled thereto and is coupled to the pixel electrode column adjacent to the third pixel electrode column PX3. A distance between the third pixel electrode column PX3 and the fourth data line D4 is a sixth distance d6, and the sixth distance d6 is greater than the third distance d3. In this way, it may be possible to prevent the third touch line T3 from being in contact with the third pixel electrode column PX3 or the fourth data line D4 due to a small distance between the third pixel electrode column PX3 and the fourth data line D4.

The third distance d3 is greater than the second distance d2, and the third distance d3 is equal to the first distance d1. That is, the first distance d1 is greater than the second distance d2. In this way, it may be possible to increase the third distance d3 to reduce a difference between the third distance d3 and the sixth distance d6, thereby reducing a difference between a coupling capacitance between the third pixel electrode column PX3 and the third data line D3 and a coupling capacitance between the third pixel electrode column PX3 and the fourth data line D4. As a result, a voltage difference Vp between the third pixel electrode column PX3 and the third data line D3 coupled thereto may be reduced, which may improve the display effect.

In some embodiments, the first distance d1 is in a range of 5.8 μm to 14 μm, inclusive; and at least one of the second distance d2 and the third distance d3 is less than or equal to 5.2 μm. The first distance d1 may be 6 μm; and the at least one of the second distance d2 and the third distance d3 may be 5 μm.

In some embodiments, the first distance d1 is greater than the seventh distance d7. In this way, it may be possible to reduce a difference between a coupling capacitance between the first pixel electrode column PX1 and the first data line D1 coupled thereto and a coupling capacitance between the first pixel electrode column PX1 and the second data line D2 that is coupled to the second pixel electrode column PX2 adjacent to the pixel electrode column PX1. As a result, a voltage difference Vp between the first pixel electrode column PX1 and the first data line D1 coupled thereto may be reduced, which may improve the display effect.

In some embodiments, as shown in FIG. 2, the touch display panel 101 includes the array substrate 200, and the polarity inversion mode of the touch display panel is the column inversion.

For example, the plurality of data lines may include two adjacent data lines. One data line of the two adjacent data lines is configured to transmit a data signal of a first polarity in a first frame, and transmit a data signal of a second polarity in a second frame; and the other data line of the two adjacent data lines is configured to transmit a data signal of the second polarity in the first frame, and transmit a data signal of the first polarity in the second frame. The first polarity and the second polarity are opposite to each other, and the first frame and the second frame are adjacent to each other.

The embodiments do not limit polarities of the first polarity and the second polarity. For example, the first polarity may be positive, and the second polarity may be negative. As another example, the first polarity may be negative, and the second polarity may be positive.

It will be noted that, the polarity of the data signal transmitted by the first data line D1 in the first frame is opposite to the polarity of the data signal transmitted by the first data line D1 in the second frame; similarly, the polarity of the data signal transmitted by the second data line D2 in the first frame is opposite to the polarity of the data signal transmitted by the second data line D2 in the second frame. For example, in a case where the data signal transmitted by the first data line D1 in the first frame is a negative signal, the data signal transmitted by the first data line D1 in the second frame is a positive signal, thereby preventing a polarization phenomenon of liquid crystal molecules.

In a same frame, polarities of data signals transmitted by two adjacent data lines are opposite. For example, as shown in FIGS. 4 and 7 to 9, the first data line D1 is adjacent to the second data line D2, and the second data line D2 is further adjacent to the third data line D3. Polarities of a data signal transmitted by the first data line D1 and a data signal transmitted by the second data line D2 are opposite; and polarities of the data signal transmitted by the second data line D2 and a data signal transmitted by the third data line D3 are opposite. That is, polarities of the data signal transmitted by the first data line D1 and the data signal transmitted by the third data line D3 are the same.

For example, as shown in FIG. 8, the first data line D1, the second data line D2 and the third data line D3 are three adjacent data lines. In the embodiments, the polarity inversion mode of the touch display panel is the column inversion. Therefore, in a certain frame, the data signal on the first data line D1 is the positive signal, the data signal on the second data line D2 is the negative signal, and the data signal on the third data line D3 is the positive signal; and a data signal on each pixel electrode in the first pixel electrode column PX1 is a negative signal, and a data signal on each pixel electrode in the second pixel electrode column PX2 is a positive signal. Since the first coupling capacitance cpd1 pulls the data signal on the pixel electrode in the first pixel electrode column PX1, the data signal on the pixel electrode in the first pixel electrode column PX1 is shifted toward a positive signal (i.e., a polarity that is opposite to a polarity of the data signal on the pixel electrode in the first pixel electrode column PX1). In a case where the data signal on the pixel electrode in the first pixel electrode column PX1 is −5 V, due to pull of the first coupling capacitance cpd1 to the data signal on the pixel electrode in the first pixel electrode column PX1, a change amount of the data signal on the pixel electrode in the first pixel electrode column PX1 may be 0.1 V (that is, the data signal on the pixel electrode in the first pixel electrode column PX1 changes from −5 V to −4.9 V). Correspondingly, since the second coupling capacitance cpd2 pulls the data signal on the pixel electrode in the first pixel electrode column PX1, the data signal on the pixel electrode in the first pixel electrode column PX1 is shifted toward a negative signal (i.e., a polarity that is the same as the polarity of the data signal on the pixel electrode in the first pixel electrode column PX1). In a case where the data signal on the pixel electrode in the first pixel electrode column PX1 is −5 V, due to pull of the second coupling capacitance cpd2 to the data signal on the pixel electrode in the first pixel electrode column PX1, a change amount of the data signal on the pixel electrode in the first pixel electrode column PX1 may be −0.2 V (that is, the data signal on the pixel electrode in the first pixel electrode column PX1 changes from −5 V to −5.2 V).

In summary, the pull of the first coupling capacitance cpd1 to the data signal on the pixel electrode in the first pixel electrode column PX1 is greater than the pull of the second coupling capacitance cpd2 to the data signal on the pixel electrode in the first pixel electrode column PX1. For example, the data signal on the pixel electrode in the first pixel electrode column PX1 may become −4.9 V. Since the first data line D1 pulls the data signal on the pixel electrode in the first pixel electrode column PX1 more strongly, the data signal on the pixel electrode in the first pixel electrode column PX1 is reduced (for example, the data signal on the pixel electrode in the first pixel electrode column PX1 becomes from −5 V to −4.9 V). As a result, brightness of a sub-pixel corresponding to each pixel electrode in the first pixel electrode column PX1 may be reduced. Correspondingly, since the third coupling capacitance cpd3 between the second pixel electrode column PX2 and the second data line D2 is greater than the fourth coupling capacitance cpd4 between the second pixel electrode column PX2 and the third data line D3, pull of the third coupling capacitance cpd3 to a data signal on each pixel electrode in the second pixel electrode column PX2 is greater than pull of the fourth coupling capacitance cpd4 the data signal on the pixel electrode in the second pixel electrode column PX2, and the data signal on the pixel electrode in the second pixel electrode column PX2 increase. As a result, brightness of each sub-pixel corresponding to the second pixel electrode column PX2 increases.

As described above, due to an influence of the coupling capacitance between the data line and the pixel electrode column, the brightness of the sub-pixel corresponding to the pixel electrode in the first pixel electrode column PX1 decreases, and the brightness of the sub-pixel corresponding to the pixel electrode in the second pixel electrode column PX2 increases. Therefore, color differences and brightness differences between the sub-pixel corresponding to the first pixel electrode column PX1 and the sub-pixel corresponding to the second pixel electrode column PX2 may be neutralized, which may ameliorate the color difference and the brightness difference between two ends of the touch display panel in a scanning direction, and thereby improve the display quality.

Figure 10:
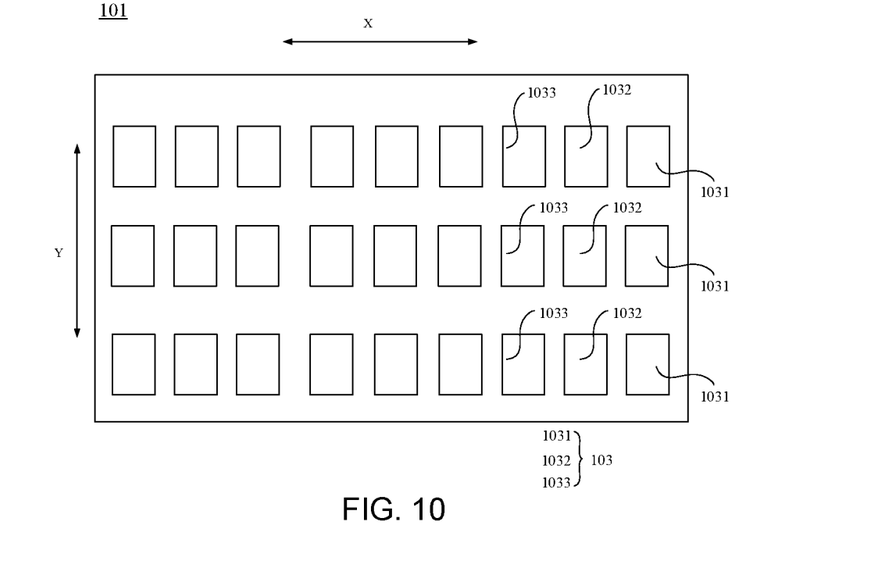
FIG. 10 is a structural diagram of another touch display device provided in some embodiments of the present disclosure.

In some embodiments, as shown in FIG. 10, the touch display panel 101 further includes a color filter layer 103. The color filter layer 103 includes filter patterns of a first color 1031, filter patterns of a second color 1032 and filter patterns of a third color 1033. Referring to FIGS. 4 and 10, each pixel electrode in the first pixel electrode column PX1 corresponds to a position where a filter pattern of the first color 1031 is located; each pixel electrode in the second pixel electrode column PX2 corresponds to a position where a filter pattern of the second color 1032 is located; and each pixel electrode in the third pixel electrode column PX3 corresponds to a position where a filter pattern of the third color 1033 is located. The first color is blue, one of the second color and the third color is red, and the other of the second color and the third color is green.

For example, as shown in FIG. 9, in a case where the array substrate 200 includes the third touch lines T3, each pixel electrode in the first pixel electrode column PX1 corresponds to a position where a blue filter pattern is located, each pixel electrode in the second pixel electrode column PX2 corresponds to a position where a green filter pattern is located; and each pixel electrode in the third pixel electrode column PX3 corresponds to a position where a red filter pattern is located.

As another example, as shown in FIG. 8, in a case where the array substrate 200 includes the second touch lines T2, each pixel electrode in the first pixel electrode column PX1 corresponds to a position where a blue filter pattern is located, each pixel electrode in the second pixel electrode column PX2 corresponds to a position where a red filter pattern is located, and each pixel electrode in the third pixel electrode column PX3 corresponds to a position where a green filter pattern is located.

The foregoing descriptions are merely specific implementations of the present disclosure, but the protection scope of the present disclosure is not limited thereto. Any changes or replacements that a person skilled in the art could readily conceive of within the technical scope of the present disclosure shall be included in the protection scope of the present disclosure. Therefore, the protection scope of the present disclosure shall be subject to the protection scope of the claims.

What is claimed is:

1. An array substrate, characterized in that the array substrata comprising:

a substrate;

a plurality of pixel electrodes disposed on the substrate and distributed in an array, in the plurality of pixel electrodes, pixel electrodes arranged in a column constituting a pixel electrode column; and a plurality of data lines and a plurality of touch lines that are disposed on the substrate, the plurality of data lines and the plurality of touch lines being disposed in a same layer, wherein the plurality of pixel electrodes include first pixel electrode columns, second pixel electrode columns and third pixel electrode columns; the plurality of data lines include: first data lines each coupled to a first pixel electrode column, second data lines each coupled to a second pixel electrode column, and third data lines each coupled to a third pixel electrode column; in a row direction of the plurality of pixel electrodes, a first data line coupled to the first pixel electrode column, the first pixel electrode column, a second data line coupled to the second pixel electrode column, the second pixel electrode column, a third data line coupled to the third pixel electrode column and the third pixel electrode column are arranged in sequence;

the plurality of touch lines include first touch lines, a first touch line in the first touch lines is located between the first pixel electrode column and the second data line; and a distance between the first pixel electrode column and the first data line is a first distance, a distance between the second pixel electrode column and the second data line is a second distance, a distance between the third pixel electrode column and the third data line is a third distance, and a distance between the first pixel electrode column and the second data line is a fourth distance; and the first distance is less than the fourth distance, and the first distance is greater than at least one of the second distance and the third distance.

2. The array substrate according to claim 1, wherein the first distance is greater than the second distance and the third distance, and the second distance is equal to the third distance.

3. The array substrate according to claim 2, wherein distances between the second pixel electrode column and two data lines that are respectively located on two sides thereof and adjacent thereto are equal; and distances between the third pixel electrode column and two data lines that are respectively located on two sides thereof and adjacent thereto are equal.

4. The array substrate according to claim 1, wherein the plurality of touch lines further include second touch lines, a second touch line in the second touch lines is located between the second pixel electrode column and the third data line; and a distance between the second pixel electrode column and the third data line is a fifth distance, the fifth distance is greater than the second distance, and the second distance is greater than the third distance.

5. The array substrate according to claim 4, wherein the second distance is equal to the first distance.

6. The array substrate according to claim 1, wherein the plurality of data lines further include fourth data lines, a fourth data line in the fourth data lines is located on a side of the third pixel electrode column away from the third data line;

the plurality of touch lines further include third touch lines, a third touch line in the third touch lines is located between the third pixel electrode column and the fourth data line; and a distance between the third pixel electrode column and the fourth data line is a sixth distance, the sixth distance is greater than the third distance, and the third distance is greater than the second distance.

7. The array substrate according to claim 6, wherein the third distance is equal to the first distance.

8. The array substrate according to claim 1, wherein the first distance is in a range of 5.8 μm to 14 μm, inclusive; and at least one of the second distance and the third distance is less than or equal to 5.2 μm.

9. The array substrate according to claim 8, wherein the first distance is 6 μm; and the at least one of the second distance and the third distance is 5 μm.

10. The array substrate according to claim 1, wherein a distance between the first touch line and the first pixel electrode column is a seventh distance, a distance between the first touch line and the second data line is an eighth distance, and the seventh distance is greater than the eighth distance.

11. The array substrate according to claim 10, wherein the seventh distance is in a range of 1 μm to 10 μm, inclusive; and the eighth distance is in a range of 1 μm to 10 μm, inclusive.

12. The array substrate according to claim 11, wherein the seventh distance is 5.7 μm; and the eighth distance is 4.5 μm.

13. The array substrate according to claim 10, wherein the first distance is greater than the seventh distance.

14. The array substrate according to claim 1, further comprising:

a common electrode layer located on a side of the plurality of pixel electrodes away from the substrate, wherein the common electrode layer has at least one group of slits corresponding to a pixel electrode in the plurality of pixel electrodes, each group of slits includes a plurality of slits arranged in parallel, and an included angle between each slit and a column direction of the plurality of pixel electrodes is in a range of 5° to 20°, inclusive.

15. A touch display panel, comprising the array substrate according to claim 1;

a polarity inversion mode of the touch display panel is column inversion.

16. The touch display panel according to claim 15, further comprising:

a color filter layer including filter patterns of a first color, filter patterns of a second color, and filter patterns of a third color, wherein each pixel electrode in the first pixel electrode column corresponds to a position where a filter pattern of the first color in the filter patterns of the first color is located;

each pixel electrode in the second pixel electrode column corresponds to a position where a filter pattern of the second color in the filter patterns of the second color is located; and each pixel electrode in the third pixel electrode column corresponds to a position where a filter pattern of the third color in the filter patterns of the third color is located;

wherein the first color is blue, one of the second color and the third color is red, and another one of the second color and the third color is green.

17. The touch display panel according to claim 16, wherein
the plurality of touch lines in the array substrate further includes second touch lines, a second touch line in the second touch lines is located between the second pixel electrode column and the third data line, and a distance between the second pixel electrode column and the third data line is a fifth distance, the fifth distance is greater than the second distance, and the second distance is greater than the third distance; and the second color is red, and the third color is green; or
the plurality of data lines further include fourth data lines, a fourth data line in the fourth data lines is located on a side of the third pixel electrode column away from the third data line, the plurality of touch lines in the array substrate further includes third touch lines, a third touch line in the third touch lines is located between the third pixel electrode column and the fourth data line; a distance between the third pixel electrode column and the fourth data line is a sixth distance, the sixth distance is greater than the third distance, and the third distance is greater than the second distance; and the second color is green, and the third color is red.

18. A touch display device, comprising the touch display panel according to claim 15.

19. The touch display panel according to claim 15, wherein the array substrate further includes:
a common electrode layer located on a side of the plurality of pixel electrodes away from the substrate, wherein
the common electrode layer has at least one group of slits corresponding to a pixel electrode in the plurality of pixel electrodes, each group of slits includes a plurality of slits arranged in parallel, and an included angle between each slit and a column direction of the plurality of pixel electrodes is in a range of 5° to 20°, inclusive.

* * * * *